(12) United States Patent
Chen

(10) Patent No.: US 7,253,649 B1
(45) Date of Patent: Aug. 7, 2007

(54) AUTOMATIC MERCURY PROBE FOR USE WITH A SEMICONDUCTOR WAFER

(75) Inventor: James T. Chen, San Mateo, CA (US)

(73) Assignee: Four Dimensions, Inc,, Hayward, CA (US)

( * ) Notice: Subject to any disclaimer, the term of this patent is extended or adjusted under 35 U.S.C. 154(b) by 0 days.

(21) Appl. No.: 11/343,670

(22) Filed: Jan. 31, 2006

(51) Int. Cl.
*G01R 31/02* (2006.01)
(52) U.S. Cl. .................................... 324/754
(58) Field of Classification Search ........ 324/754–762, 324/72.5, 133, 149, 158.1; 439/482, 66–72
See application file for complete search history.

(56) References Cited

U.S. PATENT DOCUMENTS

| | | | | |
|---|---|---|---|---|
| 4,101,830 A | * | 7/1978 | Greig | 324/754 |
| 4,409,547 A | * | 10/1983 | Lederman | 324/756 |
| 4,521,730 A | * | 6/1985 | Shulman | 324/754 |
| 5,321,453 A | * | 6/1994 | Mori et al. | 324/754 |

* cited by examiner

*Primary Examiner*—Vinh P. Nguyen
(74) *Attorney, Agent, or Firm*—Allston L. Jones

(57) ABSTRACT

An upward facing probing mechanism using mercury probe contacts for accurate automatic multi-site measurements of a semiconductor wafer, especially of ultra-shallow ion implanted layers on a semiconductor wafer held top surface facing downward. A fixed force is applied to the wafer regardless of the thickness of the wafer through the of use of a regulated pressure piston. Incorporated are a plurality of spring-loaded rod assemblies to support the floating probe head to position the probe head face into full contact with the wafer surface accurately placing all mercury contacts on the surface of the wafer regardless of the inclination of the wafer as a result of the even support of the probe head by the spring-loaded rod assemblies. Included is a mechanism to refresh the mercury contacts for each probing with full containment and recovery of the mercury used in each probing.

24 Claims, 10 Drawing Sheets

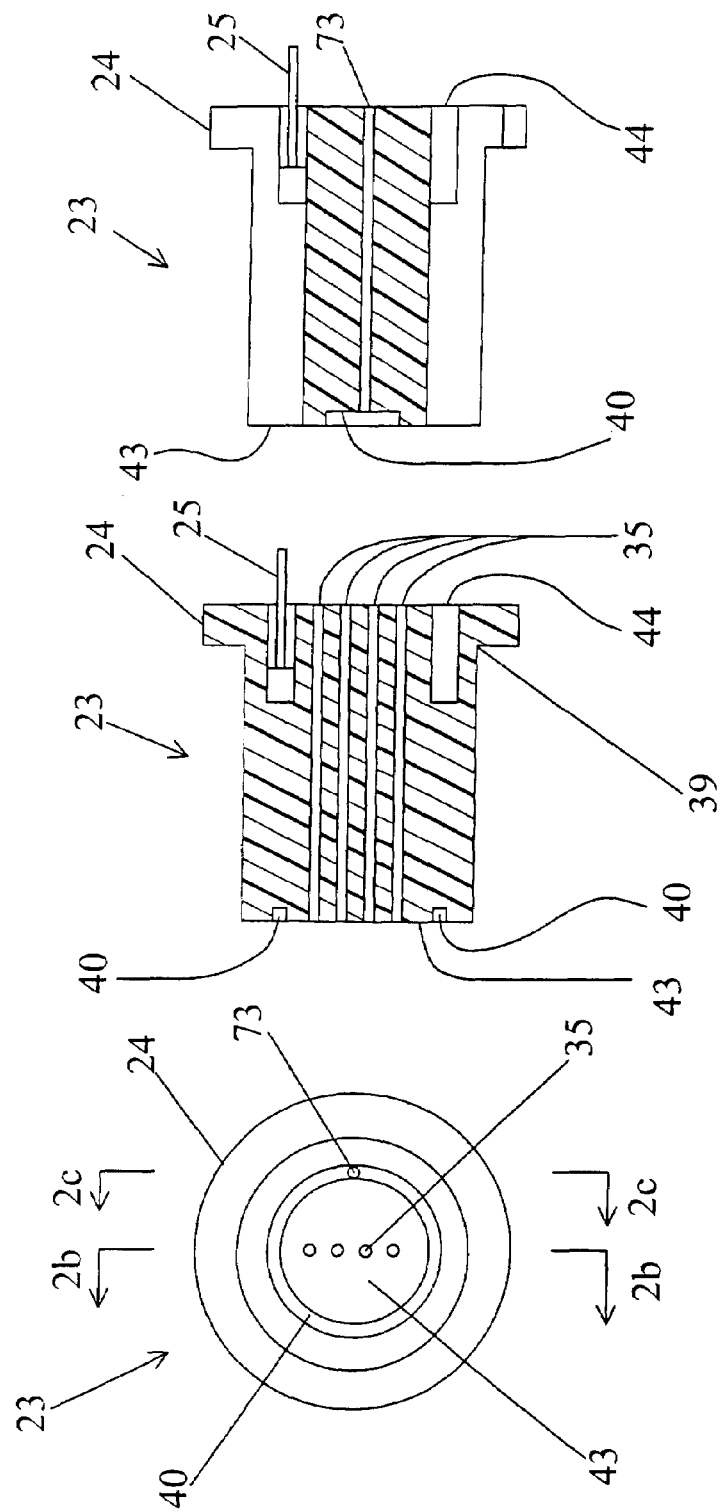

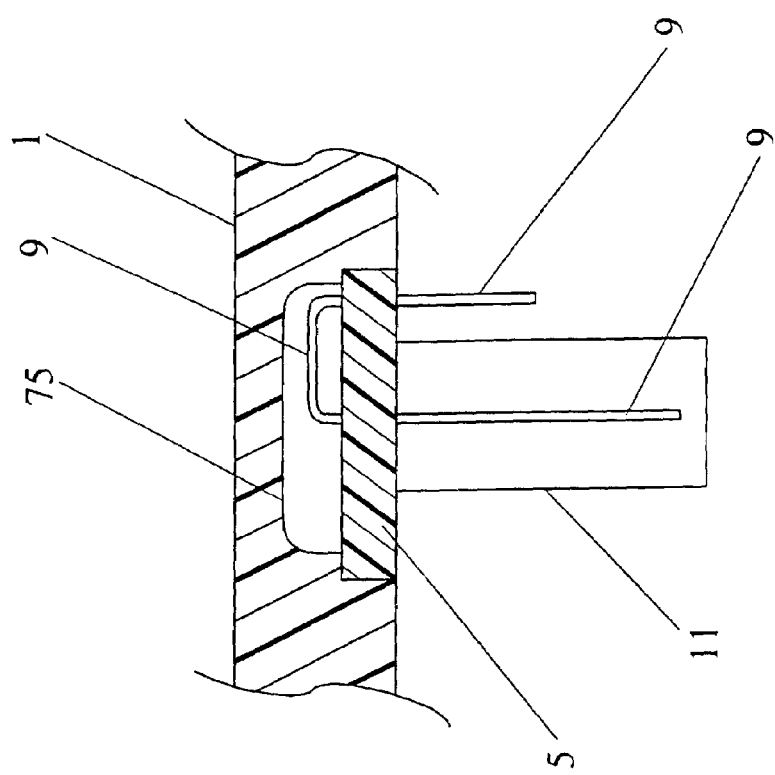

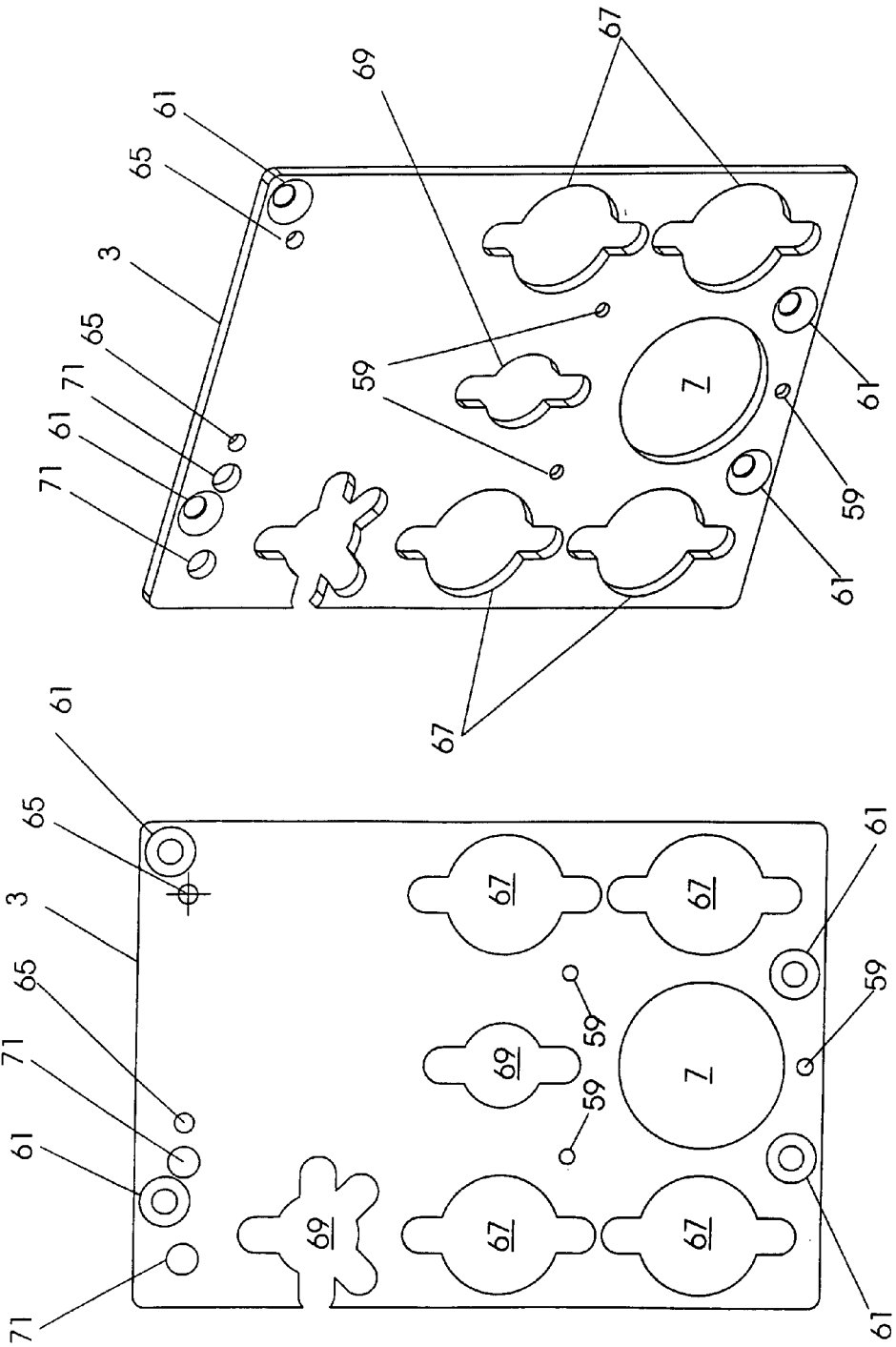

AUTOMATIC MERCURY PROBE FOR USE WITH A SEMICONDUCTOR WAFER

CROSS-REFERENCE

This patent application claims priority from an application by the same title having Ser. No. 10/912,422 filed Aug. 4, 2004 now abandoned with that application claiming priority from a Provisional Patent Application having Ser. No. 60/493,870 that was filed on Aug. 7, 2003.

BACKGROUND OF THE INVENTION

1. Field of the Invention

This invention relates to probe system for use with semiconductor wafers. More particularly, it relates to a probe system having an upward facing probe head disposed to interface with the top surface of a wafer-under-test with the wafer held upside down by a wafer support chuck. Said probe system including an evenly spring-supported, gas piston push-pulled, upward-facing probe head, wherein one or more mercury electrodes of various shape and area can be formed to make low-pressure uniform and clean contacts in the upward facing orientation with the upside down held wafer-under-test. Said probe head, being evenly spring-supported, easily adopts itself to the top surface of the wafer, which may have some inclination. Said probe system is vertically push-pulled by a gas piston for probing the surface of the wafer with consistent force regardless of the thickness of the wafer.

2. Description of the Background Art

Four-point probe systems are commonly used in device fabrications for measuring and mapping sheet resistivity of ion implanted layers and metal film depositions of a blank test semiconductor wafer during the production of integrated circuits (ICs). However, the ion implanted or infused layer of the most advanced ICs are so shallow that a significant portion of test current injected from one of the needles of the four-point probe to such layer can easily leak into the opposite type substrate. This uncontrollable test current leakage can cause deterioration of measurement repeatability and accuracy to the ion implanted layer. Penetration of the probe needles through the implanted layer may also cause the same measurement repeatability problems. These are becoming a greater problem as the geometry of semiconductor devices gets smaller and smaller as technology advances.

Also, if a first test was performed on a wafer with a metal film, and the next test to be performed is on an ion-implanted wafer, it usually is necessary to change the probe head to get the best measurement results and avoiding cross contamination. Previously, changing probe heads has been done manually for all four-point probe systems. Even in a fully automatic cassette-to-cassette system, there is only one probe head that is installed in the system, and there is no provision for automatically changing that single probe head as the types of tests that need to be performed vary. There too that probe head must be changed manually. Changing probe heads is not only time consuming, but also makes it easy to introduce contaminating particles into the system's mini-environment. Furthermore, mistakes may also happen in changing the probe heads.

U.S. Pat. No. 6,435,045 issued Aug. 20, 2002, entitled Apparatus and Method for Automatically Changing the Probe-Head in a Four-Point Probe System (co-owned by the same entity as the current application) discloses a system that automatically changes the probe-heads between tests thus overcoming cross-contamination and errors in changing of the probe heads. This system uses probe needles and thus is less desirable for the newer, smaller geometry semiconductor devices that are becoming increasingly popular for the reasons outlined above.

Severin et al. (U.S. Pat. No. 3,794,912 issued Feb. 26, 1974) disclosed a basic four-point probe that includes mercury contacts to a semiconductor wafer. This system contains no safeguard on the handling of the mercury and is not an automatic system. Greig (U.S. Pat. No. 4,101,830 issued Jul. 18, 1978) disclosed a non-four point probe system that utilizes mercury contacts to a semiconductor device. This system also is not automatic and has only marginal safeguards on the handling of mercury.

Shulman (U.S. Pat. No. 4,521,730), Lederman (U.S. Pat. No. 4,409,547), and Mazur et al. (U.S. Pat. No. 5,036,271) each disclose a mercury probe system that interfaces with the wafer right side up and the probes extending downward. Additionally, each of the above-listed patents further disclose, respectively, a method for refreshing the mercury in the probe, the suggested use of springs to bias the mercury probe head to the wafer, and a setup for enabling automatic mercury probing. However, in addition to not disclosing a mercury probe system with the probes extend upward, the mercury probes disclosed in each of those patents cannot facilitate multiple mercury contacts in various shapes and area sizes to engage the wafer-under-test.

The present invention overcomes all of the above problems with the prior art as will be seen in the following description of the present invention.

SUMMARY OF THE INVENTION

The present invention provides an automatic test head system and method that provides a set of fresh, various sized, mercury contacts to a wafer-under-test which is safer and cleaner than use of prior art needle probes. More particularly, the present invention is a probe system having an upward facing probe head disposed to interface with a top surface of a wafer-under-test with the wafer held upside down by a wafer support chuck. The instant probe system of the present invention includes an evenly spring-supported, gas piston push-pulled, upward-facing probe head, wherein one or more mercury electrodes of various shape and area can be formed to make low-pressure uniform and clean contacts in the upward facing orientation with the downward-facing top surface of the wafer-under-test. The probe head of the instant invention, is evenly spring-supported that easily adopts itself to the downward facing top surface of the wafer regardless of it having some inclination. The vertical push-pulled movement of the probe head is performed by a gas piston with consistent force regardless of the thickness of the wafer-under-test.

The present invention also introduces a four-point probe system that includes four non-wetting fine mercury filled columns to replace the previously used probe needles of conventional four-point probes. Also, it uses an evenly spring-loaded, piston driven, probe head to guide the mercury filled columns into contact with the wafer surface, thereby enabling the mercury in each of the columns to make good contact with wafers of different thicknesses and even when the surface of the wafer is not exactly parallel to the face of the probe head before they are in full contact.

Using fine mercury filled columns to replace prior art probe needles of four-point probes results in: (i) the contacts not penetrating into or through the thin ion implanted or infused layer of the wafer, and (ii) the mercury columns provide much more uniform and soft contacts to the test wafer. Uniform probing contact of the wafer results in less current concentration at the point of test current injection, and soft probing minimizes crystal deformation which causes the energy band gap to reduce; both of these keep the current injected from the current probe from leaking into the substrate and causing unrepeatable probe measurements to an ultra-shallow layer.

Further, use of an evenly spring biased and piston driven probe head for pushing the probe head into contact with the wafer enables uniform probe face contact to the wafer-under-test thus ensures uniform vacuum force to pull the mercury in each of the mercury columns to contact the test wafer, even if the wafer surface is not parallel to the face of the probe head before it is in full contact with the wafer.

Additionally, for optimum performance of the present invention, a liquid that does not wet the surface of the semiconductor wafer is preferred. A liquid that has been found to have the desired characteristics is fresh mercury which is retained and controlled by the present invention to prevent the mercury sticking to the wafer or exposure of the operators to the mercury before, during and after testing.

More generally, the present invention provides a multi-point mercury probe that probes a test wafer that is held upside-down by a chuck on a wafer stage opposite the upward oriented face of the multi-point probe head of the present invention. The present invention is illustrated herein as a four-point mechanism which comprises a probe head with four very fine mercury-guiding open ended passages that open upward toward the test wafer surface, each fine passage having one end that terminates at the flat upper face of the probe head and the other end linking to a mercury supply reservoir through tubing. Before beginning the actual test, a vacuum is applied to all four mercury supply reservoirs to clear the tubes and mercury guiding passages in the probe head of any mercury and debris that maybe still be therein from a previous probing by drawing it back into the top of each of the mercury supply reservoirs. Then, once the wafer stage positions the wafer in the desired position above the probe head, the probe head is advanced upward to press the flat upper face of the probe head against the processed surface of the test wafer with the four mercury guiding passages precisionally placed opposite the desired surface position of the wafer. Once the probe head is in place, fresh mercury is pulled up from the bottom of each reservoir through each guiding passage in the probe head to make contact with the test wafer by a vacuum supplied to a groove in the flat upper face of the probe head that surrounds the upper end of all of the guiding passages through the probe head. To insure that the face of the probe head is making full contact with the surface of the test wafer, the probe head is elastically biased toward the surface of the test wafer with springs so that all four mercury columns in the guiding passages can be pulled up to make contact with the wafer even if the wafer surface is not parallel to the flat upper face of the probe head. Once each test is performed, the vacuum is reversed to pull the mercury back into the supply reservoirs from the guiding passages and tubes.

The initial refreshing of the mercury before each probing ensures clean, good mercury contacts for each automatic probing, as well as contributing to the containment of the mercury to prevent unclean mercury (e.g., oxidized or debris containing mercury) being advanced to the next position of the test wafer, or a new test wafer, where it may stick to the surface of the wafer rather than only contacting the wafer surface by the non-wetting nature of fresh mercury.

The push-pull gas piston pulls the probe head back by depressurizing the pushing compressed gas, thus disengaging the probe head from the wafer. The use of this mechanism it is assured that the probe head will apply a fixed force on the wafer regardless of the thickness of the wafer thus making the mercury contact areas much more consistent.

BRIEF DESCRIPTION OF THE DRAWINGS

FIG. 2a is a plan top view of the four-point probe head of the present invention;

FIG. 2b is a center cross-sectioned side view taken along line 2b-2b in FIG. 2a of the four-point probe head of the present invention;

FIG. 2c is a cross-sectioned side view taken along line 2c-2c in FIG. 2a of the four-point probe head of the present invention;

FIG. 3c is a simplified side cross-sectioned view of a mercury supply reservoir attached to the top plate to illustrate the dressing of the siphon tube 9:

FIG. 4 is a front plan view of the reservoir mounting plate of the present invention as shown in FIG. 1;

FIG. 5 is a front perspective view of the reservoir mounting plate of the present invention as shown in FIG. 1;

DETAILED DESCRIPTION OF THE PRESENT INVENTION

As will be seen from the following discussion, the multi-point probe of the present invention, illustrated in the following discussion as a four-point probe, utilizes mercury, which is electrically conductive, drawn up through four small diameter tubes and passages in a probe head by means of a vacuum as mercury probes for testing a semiconductor wafer. Additionally, it will become clear to one skilled in the art that an extremely small diameter mercury contact provides a small diameter electrically conductive probe of the surface of the wafer to minimizing probe penetration of the wafer, mechanically and electrically, in order to minimize disturbance to the ultra-shallow implanted layer on the wafer for more accurate sheet resistivity measurements.

Figure 1:
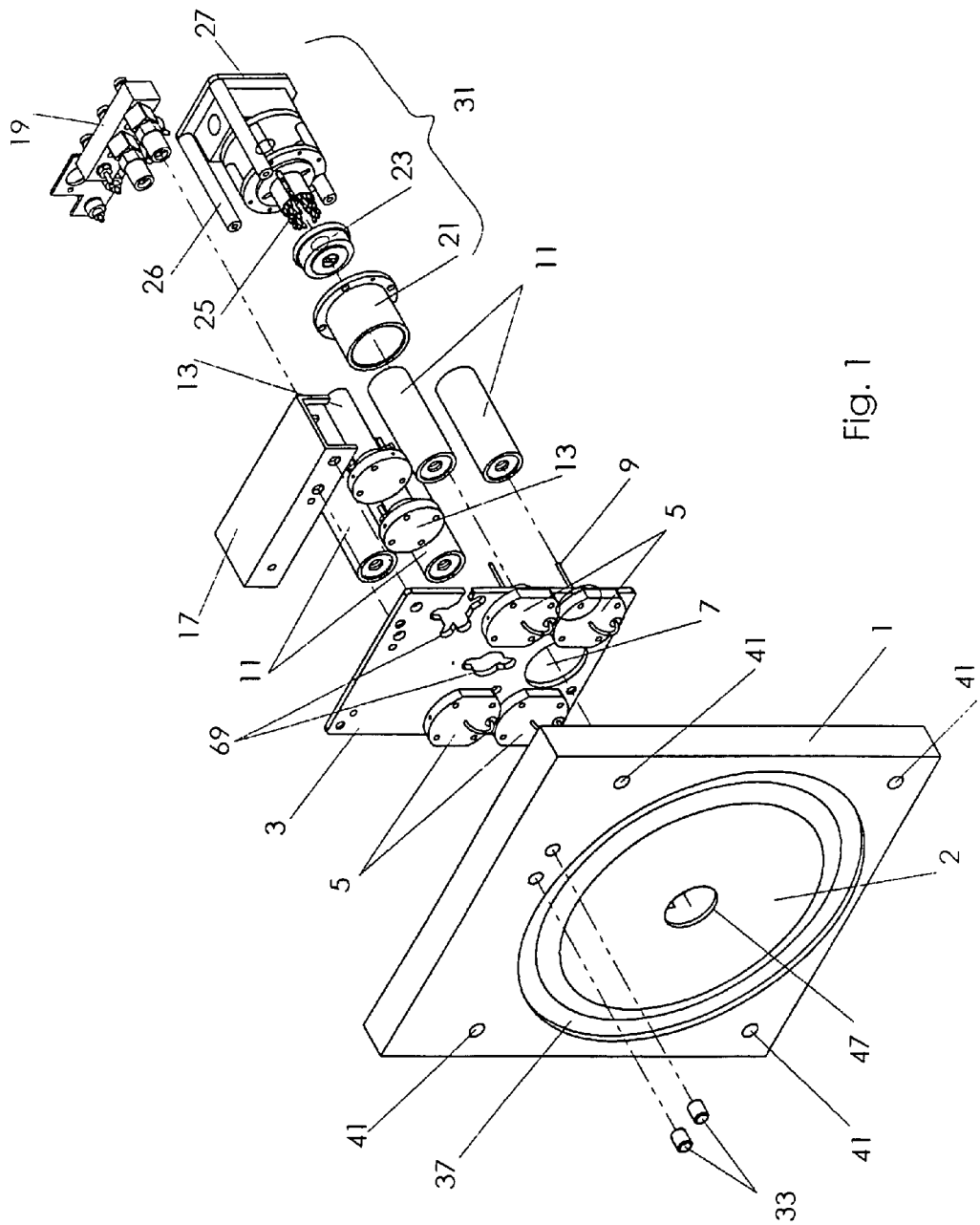
FIG. 1 is an exploded perspective view of the mercury probe, four-point probe stage of the present invention.

FIG. 1 is an exploded perspective view of the mercury four-point probe system of the present invention minus electrical cabling, and vacuum components and tubing. This has been done to make the mechanical structure of the present invention more easily visualized. Additionally, this view is rotated counter-clockwise 90° from the position in which the system will be oriented when in use. The following description of what is shown in FIG. 1 will flow substantially from left to right. The first component encountered is top plate 1 that defines on its outer, or top, surface as will be realized as we progress through the discussion, a semiconductor wafer facing surface 2 that does not come into contact with the surface of the wafer at any time. When in position, the top of the semiconductor test wafer will be held by a chuck with the top of the wafer oriented downward facing wafer facing surface 2 of top plate 1. Located centrally through top plate 1 is hole 47 that is sized to permit the face portion of the four-point probe head 23 to pass through as will be explained further below.

Next there is shown reservoir mounting plate 3 having four supply reservoir holders 5 located within holes in plate 3 which will be seen when FIGS. 4 and 5 are discussed. Extending centrally out the back side of each of supply reservoir holders 5 are siphon tubes 9 the purpose of which will be better understood when FIG. 7 is discussed. Siphon tubes 9 are made of a selected hard elastic material that is not chemically reactive with the mercury, tubes 9 could be stainless steel since it has the desired characteristics. To the right of plate 3 in this view are four supply reservoirs 11 that are discussed further with respect to FIGS. 6b and 7. Plate 3 also defines therethrough in the lower center a circular probe head guide passage hole 7. Two additional openings are defined by plate 3, one above hole 7 and the other above the top right supply reservoir holder 5; these are mounting holes 69 for mercury recovery reservoirs 13 shown to the right of plate 3 in this view and discussed further with respect to FIGS. 6b and 7. In the top far right is shown vacuum and electrical connector assembly 19 that attaches to the far side of mounting bracket 17 (see FIGS. 6a and 6b).

Figure 2:
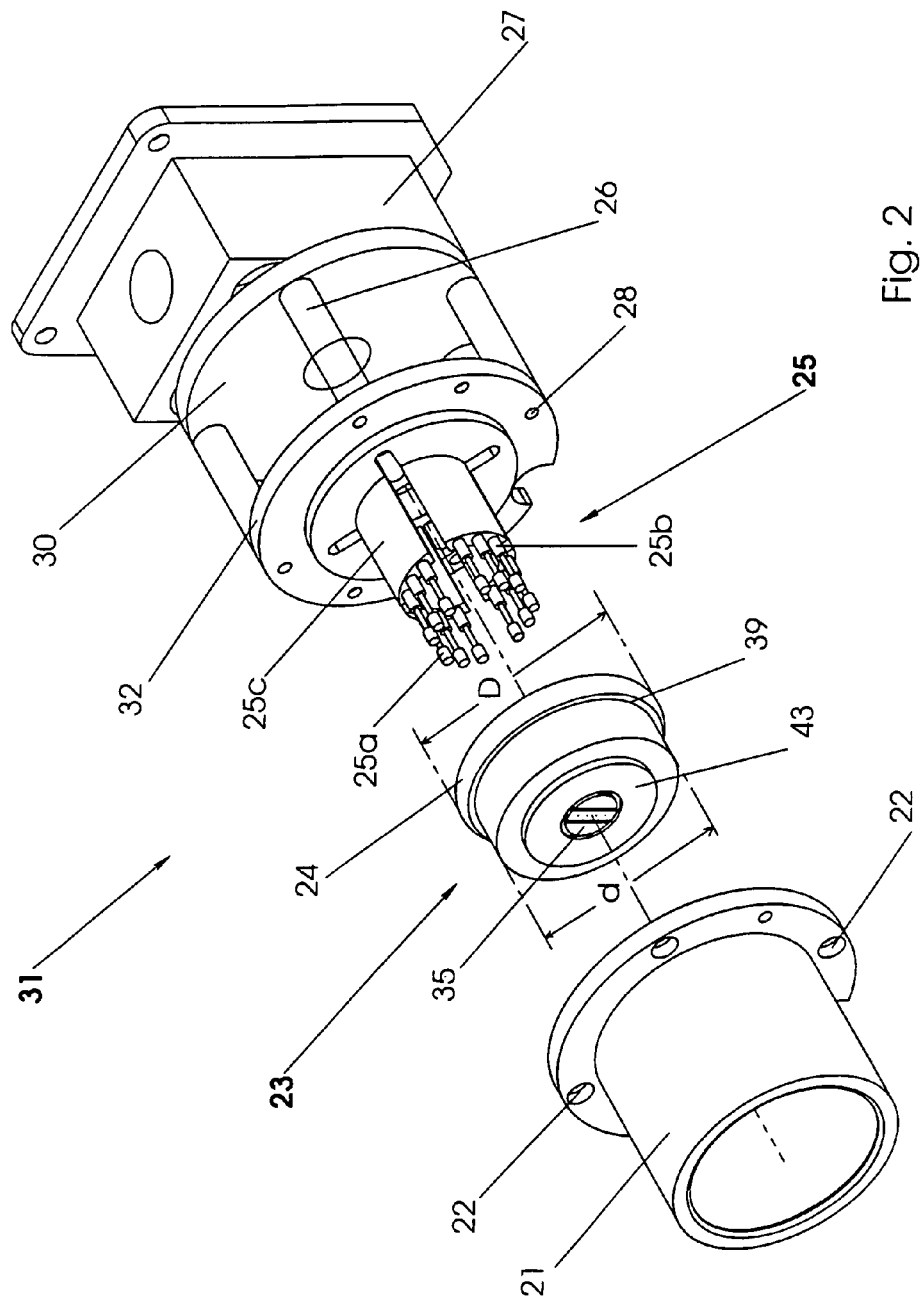
FIG. 2 is an exploded perspective close-up view of the four-point probe subassembly of the present invention as shown in FIG. 1.

At the far right four-point probe sub-assembly 31 is shown which can be more clearly seen in FIG. 2. Sub-assembly 31 includes probe head guide 21 through the majority of which four-point probe head 23 passes and, in the final assembly, partially extends outward from hole 47 in top plate 1. The largest diameter "D" ring 24 of probe head 23 is smaller than the inner diameter of probe head guide 21 and fits loosely. Similarly, the small diameter "d" of probe head 23 is smaller than the diameter of hole 47 and fits loosely therethrough. Probe head 23 includes a shoulder 39 that is closest to the bottom of probe head 23 that defines the portions having diameters "D" and "d" with the diameter D portion for better "float" being less than one-half the overall height of probe head 23. Also included in sub-assembly 31 are an array of spring-loaded rod assembles 25, the distal ends 25a of which are attached to the back (bottom) side of probe head 23. Probe head 23 is allowed to "float" within probe head guide 21 and hole 47 to allow contact surface 43 (including the center section through which four-point probe guide passages 35 are defined) of four-point probe head 23 to seek a position in full contact with the surface of the test wafer, by the action of spring-loaded rod assembles 25 discussed further below, should the wafer surface not be exactly parallel to contact surface 43 of probe head 23.

There is a combination of several factors which make it possible for probe head 23 to "float": hole 47 having a diameter that is smaller than diameter "d"; the inner diameter of probe head guide 21 being smaller than diameter "D"; ring 24 of probe head 23 having diameter "D" being that portion closest to the bottom of probe head 23; and spring-loaded rod assemblies 25 that allow contact surface 43 to take the inclination of the test wafer when brought in close proximity to that surface. Thus, when probe head 23 "floats" the central axis of probe head 23 is free to take an inclination that is not coincident or parallel to the central axis of guide 21, hole 47 and piston 27 that is common to each of them (i.e., coincident to each other) as can be seen in FIGS. 1 and 2.

A plurality of spring-loaded rod assembles 25 are arranged in a circular configuration in turret 25c (in the implementation shown in FIG. 2) to orient the distal ends 25a for attachment to the bottom of probe head 23. The proximate end 25b of the spring-loaded rod assembles 25 are attached to a moveable piston 127 of piston assembly 27 (see FIG. 9), as shown here, via turret 25c that is attached to support ring 32, supported by tubular spacers 26 from piston head 30 that is attached to an end of moveable piston 127 that extends out from piston assembly 27 in both the extended and relaxed positions. Support ring 32 includes holes 28 therethrough that are aligned with tubular spacers 26. Complementing the locations of holes 28 in support ring 32 are flange holes 22 in the flange of probe head guide 21. When assembled, probe head 23 is attached to spring-loaded rod assembles 25 and located within the tubular portion of probe head guide 21 with screws passing through holes 22 in the flange of probe head guide 21, through holes 28 in support ring 32, then through tubular spacers 26 and into tapped holes in piston head 30. When piston assembly 27 is activated, piston head 30 and all that is attached to it as discussed above move upward with the distal end of the tubular section of probe head guide 21 advanced to hole 47 in plate 1 and probe head 23 partially through hole 47 to extend contact surface 43 out from hole 47 to the surface of the test wafer. As contact surface 43 comes into contact with wafer 105, spring-loaded rod assemblies 25 elastically adjust to allow contact surface 43 of probe head 23 to take the inclination of the surface of wafer 105 to make full contact therewith. Additionally, piston assembly 27 is mounted to reservoir mounting plate 3 with screws passing through holes 59 (see FIG. 4) from the front (top) of plate 3 and into the tapped ends of spacers 29 (see FIG. 1).

While it is well known that three points define a plane one could use as few as three spring-loaded rod assemblies 25. However, the use of a greater number of spring loaded rod assemblies 25 as in FIG. 2 will assure more even distribution of force applied to probe head 23 should not all of the springs of the various spring-loaded rod assemblies be of equal strength thus averaging out the force applied to probe head 23 by the spring-loaded rod assemblies.

Figure 9:
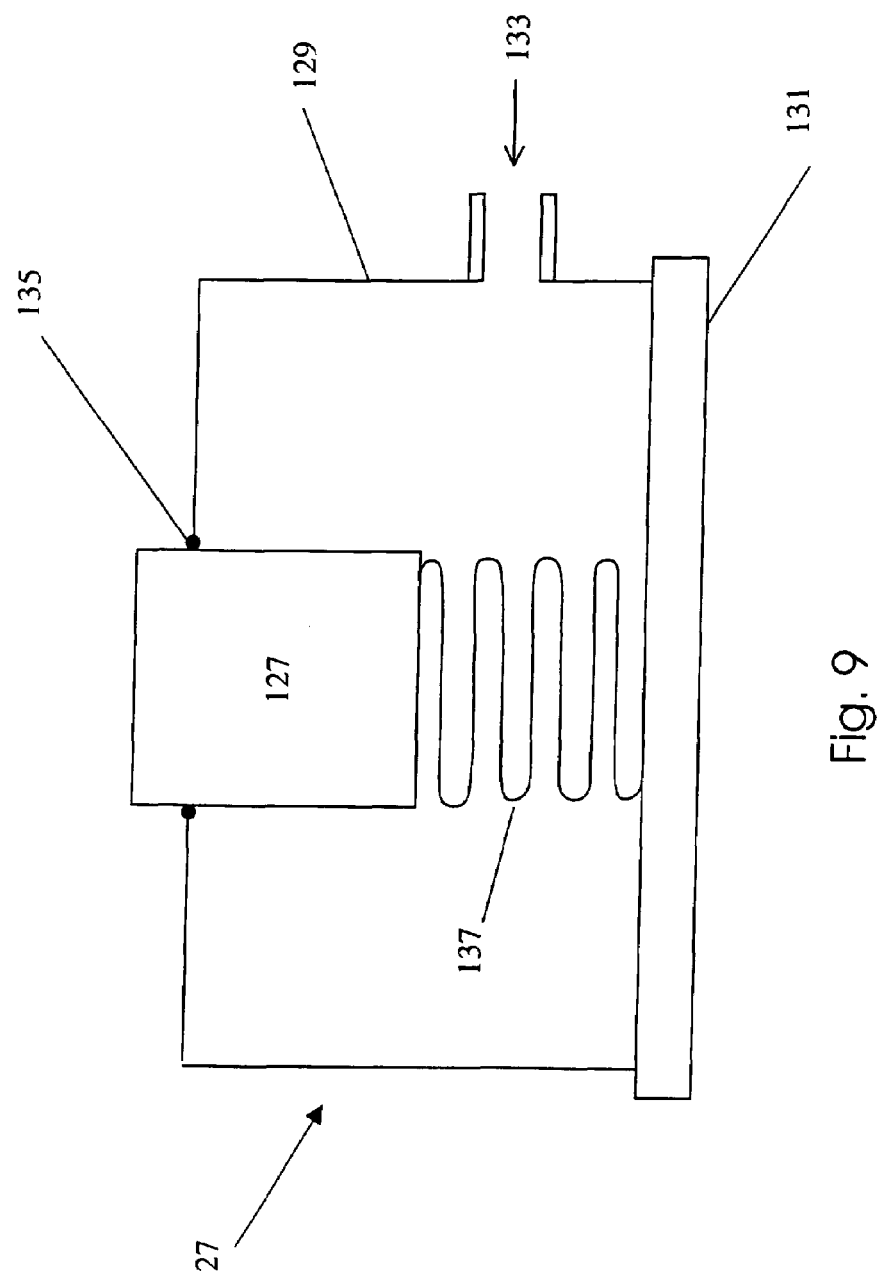
FIG. 9 is a simplified schematic view of a piston assemble.

FIG. 9 shows a simplified schematic representation of piston assembly 27. Included is piston 127 shown here in the at-rest position with the top end of the piston extending outward a short distance from the top of the outer case 129 with an air tight seal 135 between piston 127 and the hole in the top of outer case 129 through which piston 127 passes. Outer case 129 is affixed to mounting plate 131 that is the bottom of piston assembly 27 and is disposed to be attached to a fixed location to support the overall probe system. Outer case 129 includes a compressed air coupler 133 through the right side that is disposed to have attached thereto a source of compressed air. Additionally, there is a return spring 137 shown attach at one end to the bottom of piston 127 and at the other end to the interior surface of mounting plate 131.

In operation, to extend the top end of piston 127 further outward from outer case 129 than as shown in FIG. 9, compressed air of a regulated pressure is applied to compressed air coupler 133 from a pressure regulated source of compressed air. The regulated air pressure is selected to have a pressure that is much greater than that necessary to oppose the inward bias of spring 137 and to provide piston 127 with a sufficient outward stroke and force to place contact surface 43 of probe head 23 into direct contact with the downward facing surface of wafer 105 and with sufficient pressure to (1) insure that contact surface 43 is in full contact with the downward facing surface of the wafer 105 regardless of the inclination of the surface of the wafer and (2) that the pressing force from the probe head onto the wafer is essentially that provided by the compressed air, regardless of the wafer thickness. It is necessary that none of spring-loaded rod assemblies 25 is fully compressed to assure that probe head 23 always places its contact surface 43 in full contact with the surface of the wafer with uniform pressing and a constant force. Further, when the compressed air is released from piston assembly 27, return spring 137 has sufficient strength to return the piston 125 and the attached probe elements to return to the rest position shown in FIG. 9.

Referring again to FIG. 2 the components that make up four-point probe sub-assembly 31 can be seen more clearly minus mounting spacers 29. The details of four-point probe head 23 can be seen to define a linear array of four end holes of four-point probe passages 35. For the application that the present invention was designed for, passages 35 are each a cylinder with open ends that are about 200 microns in diameter. For other applications, the hole size is a matter of design choice and can be selected to matched to application. Additionally, the hole configuration and placement can also be easily changed by removing probe head 23 and replacing it with another probe head with the desired configuration and pattern.

Spring-loaded rod assemblies 25 as discussed above with an enlarged end to attach to probe head 23 is not the only spring design that could be used. Additionally spring-loaded rod assemblies 25 could be replaced with multiple segments of a compressible material with a "spring factor" that is similar to that of traditional metal or plastic spring. Also, instead of multiple segments of a compressible material, a continuous ring of a compressible material could be used. There are still other configurations of springs and spring like materials that could be used. Still further, while the use of twelve springs is shown in FIGS. 1 and 2, fewer springs could be used; as few as three of the type of springs shown could be used to perform the same function since three points define a plane, or a single coil spring having a central axis that is common to the central axis of piston 27 could be used. The inclusion of more springs provides a more evenly adjustable support and better adjusts to various inclinations that may be needed to position the end of passages 35 on the wafer surface.

FIGS. 2a-2c show details of four-point probe head 23 in a plan top view and two cross-sectioned sides view, respectively. For purposes of illustration the outline shape of probe head 23 is simplified and the sizes and proportions of the various features are not to scale. FIG. 2a shows, in a top plan view, the ends of four-point probe guide passages 35 in a center region of probe contact surface 43 that is surrounded by annular probe-head vacuum groove 40 into the bottom of which the top end of vacuum port 73 opens as shown in FIG. 2c.

FIG. 2b is a side cross-sectioned view taken along line 2b-2b in FIG. 2a. Here it can be seen that four-point probe passages 35 pass completely through probe head 23 from front to back (top to bottom when oriented to interface with a wafer as in FIG. 7). Further, it can be seen that annular probe-head vacuum groove 40 extends only a short distance into the front (top) face (contact surface 43) of probe head 23. Extending into the bottom face of probe head 23 there is shown an annular mounting groove 44 to receive the top end of each of the spring-loaded rod assemblies 25 evenly spaced apart from each other within groove 44. Into the upper portion of groove 44 the insertion of the top end of one spring-loaded rod assembly 25 is illustrated.

FIG. 2c shows a cross-sectioned side view taken along line 2c-2c in FIG. 2a. Since this slice is not taken through the center of probe head 23, only vacuum port 73, a portion of annular vacuum groove 40 in the top of probe head 23 and a portion of annular mounting groove 44 in the bottom of probe head 23 are shown, with vacuum port 73 extending from the bottom of annular probe-head vacuum groove 40 to the back (bottom) of probe head 23 groove 73 being open at both ends. Also shown, as in FIG. 2b, into the upper portion of groove 44 the insertion of the top end of one spring-loaded rod assembly 25 is illustrated In the final assembly five different tubes will be attached to the back (bottom) of probe head 23: four, one to each of the four-point probe guide passages 35 to supply either mercury or vacuum to withdraw mercury, and one to vacuum port 73 provide vacuum or air should any mercury leak from any of passages 35 onto contact surface 43 or the surface of the wafer. The operation of the present invention is more fully discussed below in relation to FIGS. 7 and 8.

Figures 3A, 3B:
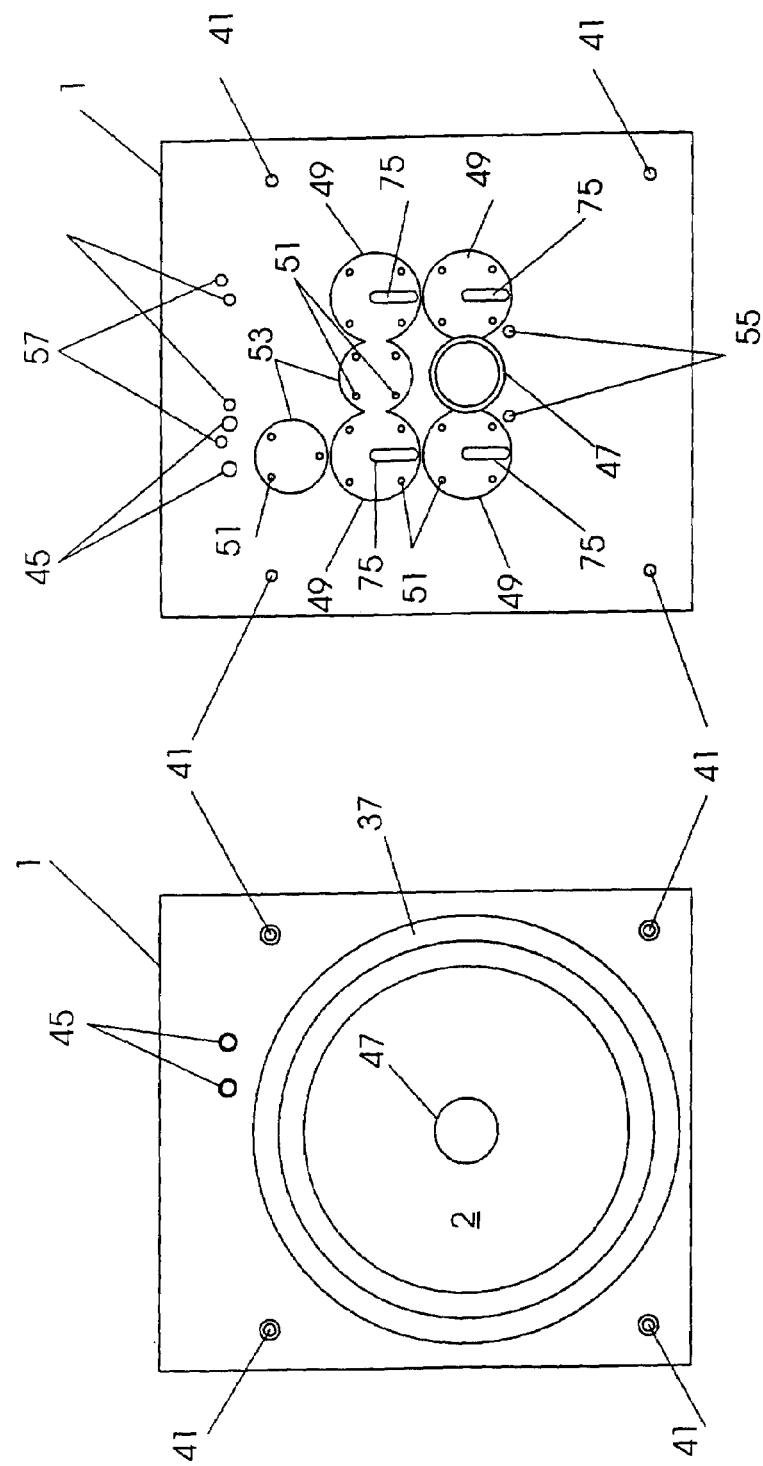
FIG. 3a is a front plan view of the top plate of the present invention as shown in FIG. 1.
FIG. 3b is a back plan view of the top plate of the present invention as shown in FIG. 1.

FIGS. 3a and 3b show the front and back sides (top and bottom), respectively, of top plate 1. The features that can be seen in both views are the various holes that pass through top plate 1. The four holes 41 are provided to mount the fully assembled four-point probe stage of the present invention for use as a part of the complete system that also includes the electronics, hoses and tubes. Holes 45 have been provided for vacuum flow control valves 33 discussed above with respect to FIG. 1 and also in relation to FIGS. 7 and 8. Hole 47 is provided to permit the face of four-point probe head 23 to extend therethrough to the surface of the test wafer when in place on the wafer stage opposite hole 47 as discussed in relation to FIG. 7.

The features that are only visible on the front (top) of top plate 1 shown in FIG. 3a is an optional debris collection groove 37. At times during testing various items of debris sometimes collect on top plate 1 and the inclusion of groove 37 provides a location to collect those items so they do not damage the surface of the wafer or fall to the floor in the test area.

In FIG. 3b, the features that are only included on the back of top plate 1 can be seen. There are two sets of tapped holes 55 and 57 to accept screws to fasten two different devices to the back of plate 1. Holes 55 are provided to receive screws that pass through holes 61 in reservoir mounting plate 3 (see FIGS. 4 and 5) to attach plate 3 to the back (bottom) of top plate 1 in the final assembly. Holes 57 are provided to receive screws that pass through the front face of mounting bracket 17 to attach bracket 17 to the back of plate 1.

Also shown on the back (bottom) of plate 1 are six machined "cut-ins" 49 and 53 that do not extend completely through plate 1 and are included to receive the ends of the supports for the various reservoirs shown in FIG. 1. In each of cut-ins 49 and 53 there are tapped holes to receive screws to mount supply reservoir holders 5 and the caps of recovery reservoirs 13 to the back (bottom) of plate 1. Cut-ins 49 are to interface with supply reservoir holders 5, and cut-ins 53 are to interface with the caps on the mercury recovery reservoirs 13.

Also shown are cut-ins 49 associated with each of the supply reservoirs, there is a vertical elongated groove 75 in the lower half with grooves 75 extending deeper into plate 1 than cut-ins 49. Grooves 75 have been provided to accommodate the vacuum tubing that extends into each supply reservoir 11. In the particular design of the present invention disclosed here, the back of plate 1 and the front of plate 3 are in direct contact with each other thus grooves 75 are necessary so that the flow tubes are not crimped and thus restrict mercury flow. The inclusion of grooves 75 are thus clearly a matter of design choice. Cut-ins 53, in the present design do not need grooves since the tubing for the recovery reservoirs remains behind plate 3.

FIG. 3c is a simplified side cross-sectioned view of a supply reservoir 11 in holder 5 attached to the back (bottom) of top plate 1. In this view tubing groove 75 is shown with siphon tube 9 in place extending from near to the bottom of supply reservoir 11 up through holder 5, making a 180° radial turn through groove 75 and then back through holder 5 outside of reservoir 11 beyond the back (bottom) of plate 1. If stainless steel tubing is used for siphon tube 9, the bend in tube 9 would be preformed before assembly of the present invention.

Figure 7:
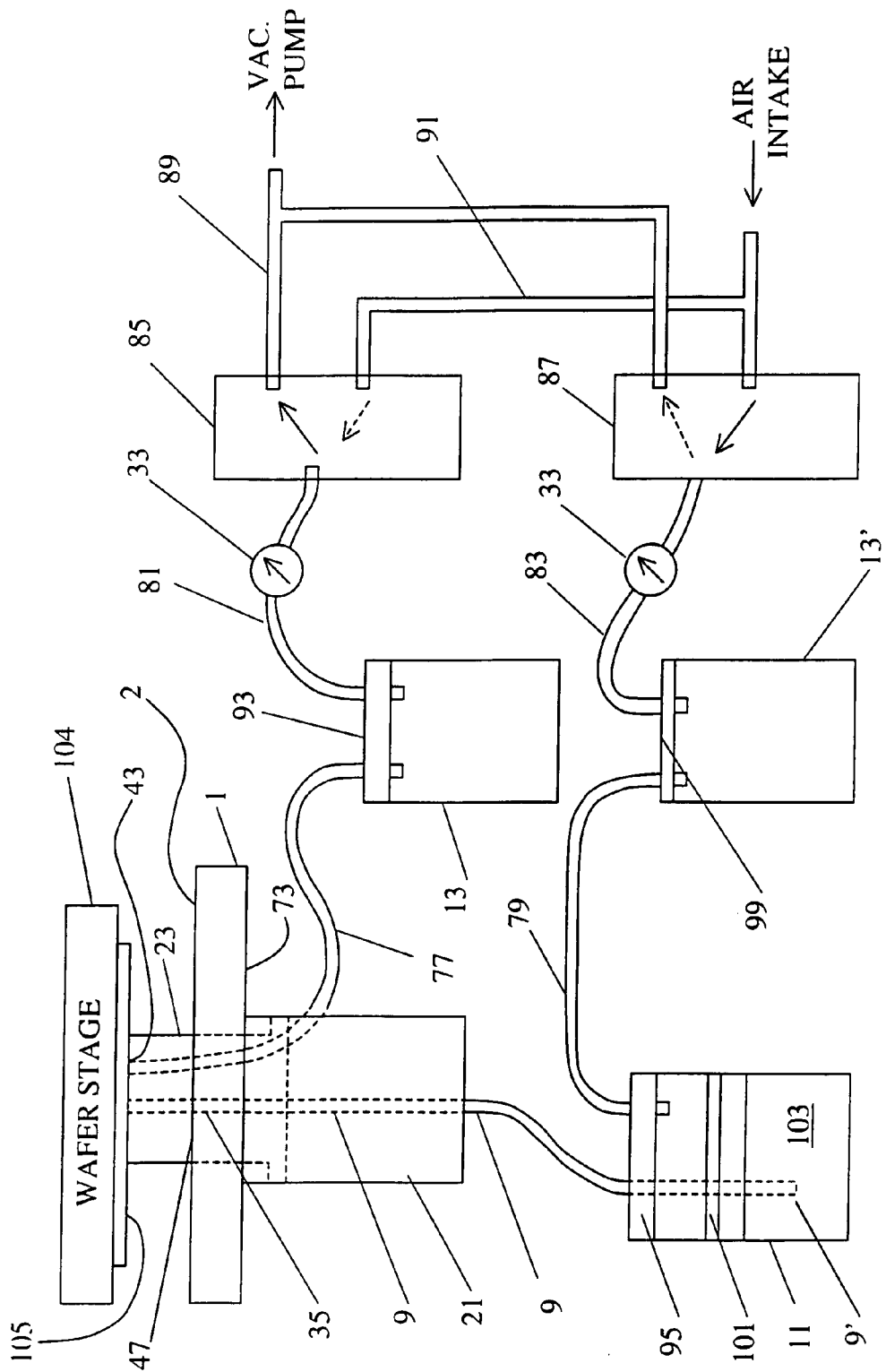
FIG. 7 is a schematic view of the vacuum and mercury probe circuit of the present invention as shown in FIG. 1.
Figure 8:
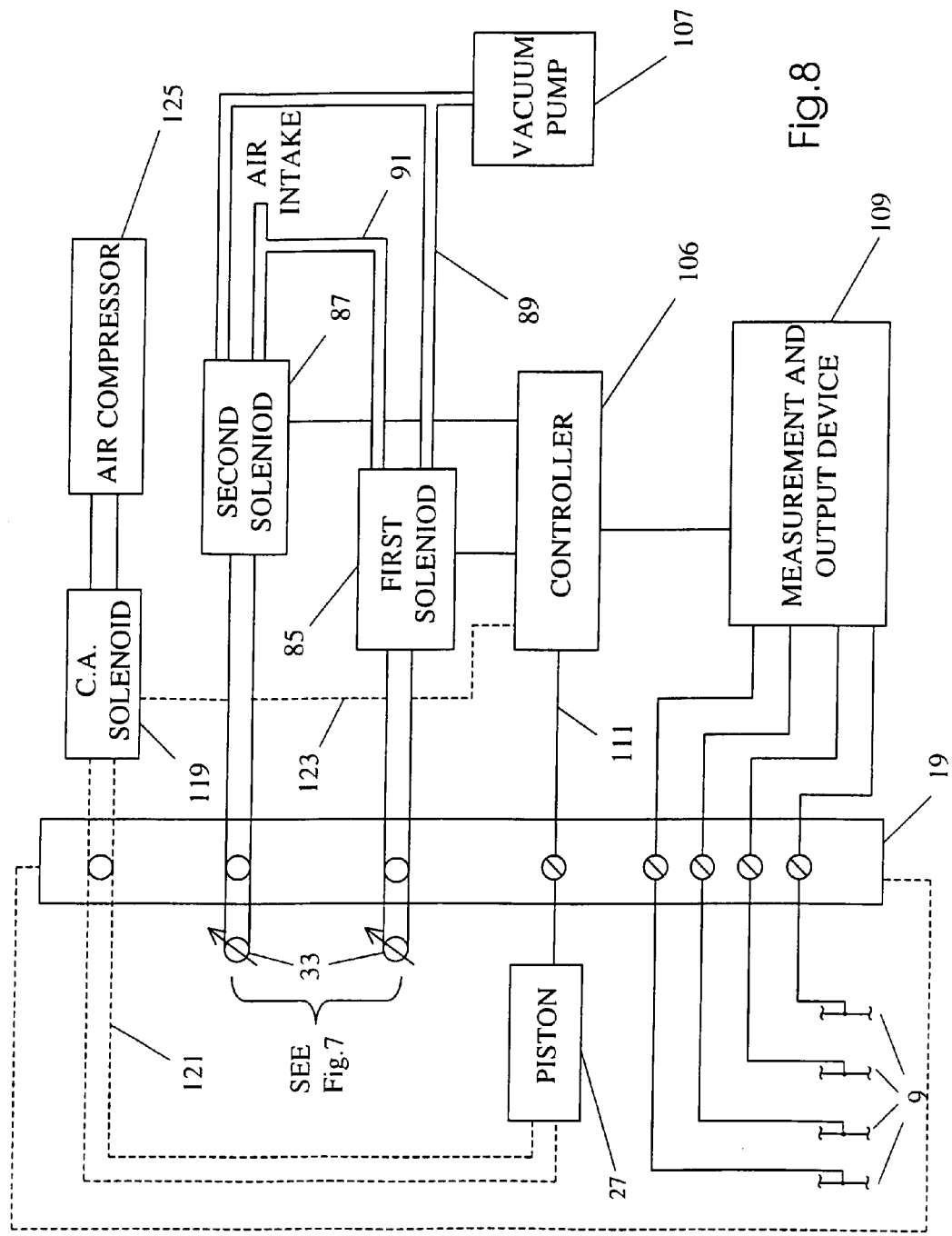
FIG. 8 is a schematic view of the electrical and pneumatic circuits and the external equipment interfacing therewith of the present invention as shown in FIG. 1.

Next, attention is directed to FIGS. 4 and 5 that are a front (top) plan view, and a front (top) perspective view, respectively, of reservoir mounting plate 3 without any of the various items that interface with it. As discussed with respect to FIG. 1, hole 7 is provided for the distal end of the main cylindrical body portion of probe head guide 21 to pass through to make contact with the back (bottom) of plate 1 encircling hole 47 when piston 27 is activated. The four holes 67 are provided to retain the four supply reservoir holders 5 to plate 3 when extended through those holes from front to back. Similarly, the two holes 69 are provided for passage therethrough of the two mercury recovery reservoirs 13 from front to back with the caps of each mercury recovery reservoir 13 on the front side of plate 3. The two holes 71 are provided for vacuum control flow valves 33 and associated hoses (not shown) to pass through. The purpose of holes 61 is discussed above with respect to FIG. 3b. Holes 65 are unthreaded pass-through holes for the screws to mount bracket 17, with those screws being received by tapped holes 57 in the back of wafer mounting plate 1. From FIG. 1 it can be seen that mounting bracket 17 has a squared off generally "U" shape and when assembled in position, one leg of the "U" is in contact with the back of plate 3 and the other leg of the "U" holds the various electrical, vacuum and air connects that are needed which will become clear when FIGS. 7 and 8 are discussed.

Figures 6A, 6B:
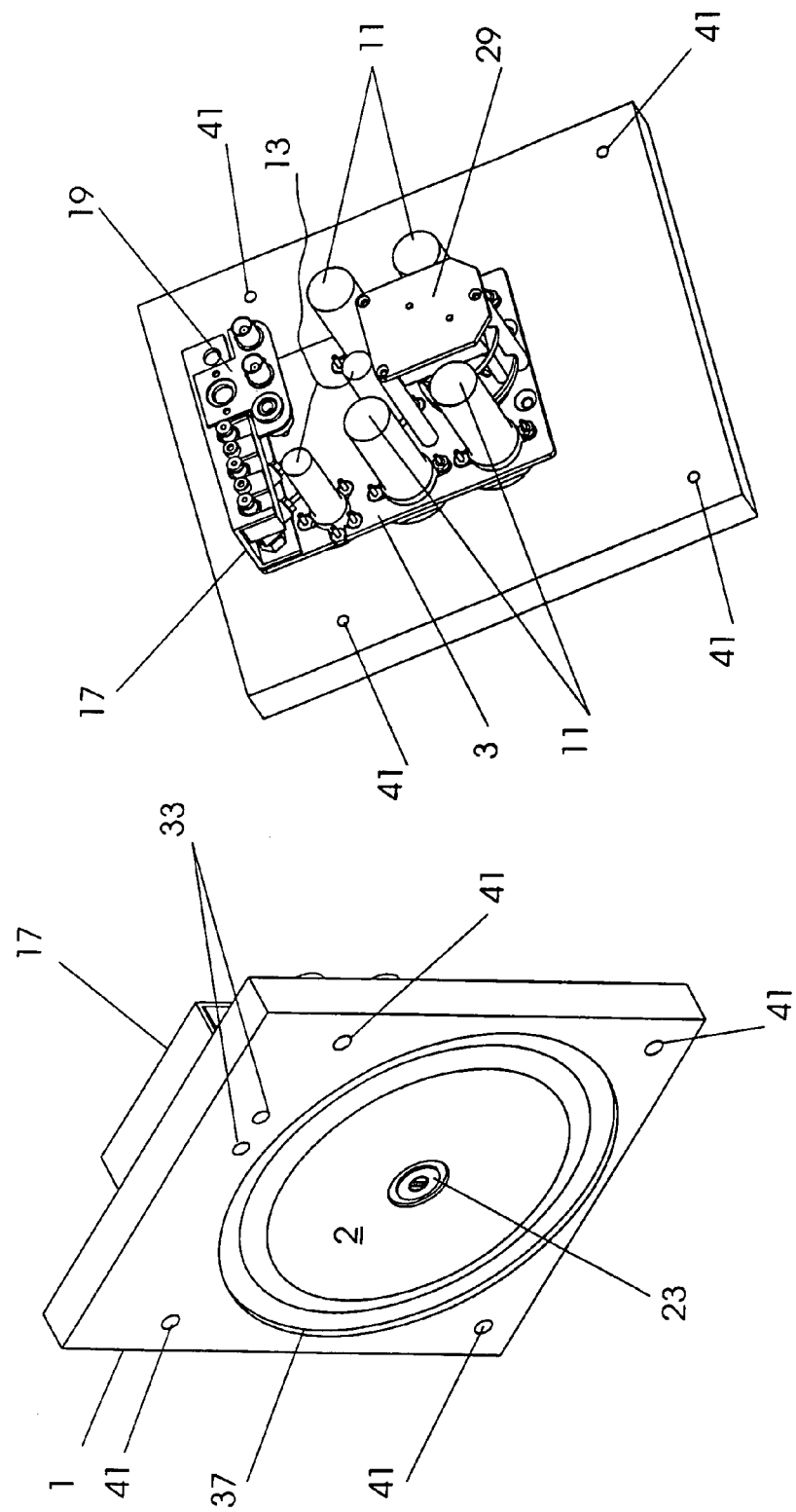
FIG. 6a is a front perspective view of the full assembled present invention as shown in FIG. 1.
FIG. 6b is a back perspective view of the full assembled present invention as shown in FIG. 1.

FIGS. 6a and 6b show the fully assembled present invention in a front (top) perspective view and a back (bottom) perspective view, respectively. From FIG. 6b the physical placement of the various components can be seen on plate 3 organized as provided for by the hole pattern in plate 3 discussed above with respect to FIGS. 4 and 5.

FIG. 7 is a schematic view of the vacuum and mercury probe circuit of the present invention that has been simplified by only including the hardware necessary to illustrate the operation of the present invention. Along that line FIG. 7 only includes one supply reservoir 11. For the four-point probe configuration of the present invention the un-shown three other supply reservoirs 11 would each be connected to different probe guide passages 35 in probe head 23 and to the same recovery reservoir 13' that is connected to the shown supply reservoir 11 with all four supply reservoirs operating in the same way and at the same time. In this schematic view piston assembly 27 (not shown) has been activated advancing four-point probe head 23 in probe head guide 21 to partially extend through hole 47 in top plate 1 with four-point probe head contact surface 43 in contact with the face of test wafer 105 that is mounted upside-down on wafer stage 104.

In the upper left there is shown top plate 1 with the top surface of test wafer 105 positioned spaced apart from wafer facing surface 2 of top plate 1 to allow probe head 23 to extend outward from hole 47 in plate 1 so that four-point probe contact surface 43 is the only portion of the present invention that is in contact with the test wafer. In contact surface 43, surrounding the top end of the probe guide holes 35 as shown in FIG. 2a is probe head vacuum groove 40 with vacuum port 73 in communication with groove 40. From the back (bottom) side of plate 1 is one end of tube 77 connected to vacuum port 73 and a second end of tube 77 pass a short distance through cap 93 of a first mercury recovery reservoir 13. A second tube 81 has one end passing a short distance through cap 93 of first mercury recovery reservoir 13 and the second end connected to a switched port of a first solenoid operated gas switch 85. Within the length of tube 81 is one of the two vacuum control valves 33 to allow the operator to adjust the strength of the vacuum drawn on vacuum groove 40 through vacuum port 73. One input port of first solenoid switch 85 is connected to tube 89 that is disposed to be connected to a vacuum source. A second input port of solenoid switch 85 is connected to tube 91 that provides intake of air from the surrounding atmosphere or another source if so desired.

In the lower portion of FIG. 7 there is shown one of the systems four mercury supply reservoirs 11, which is typical of all four. Supply reservoir 11 has an air tight cap 95 (screw on for convenience) through which there is formed two ports. A first port provides passage therethrough for one end of tube 9 that extends to just above the bottom of reservoir 11 and a second end of tube 9 connects to one of the four probe guide passages 35 in probe head 23. The second port provides passage therethrough a short distance for one end of tube 79 with the second end of tube 79 extending just through a first port of cap 99 of recovery reservoir 13'. Cap 99 includes a second port through which another tube 83 extends a short distance with the second end of tube 81 connected to a switched port of a second solenoid operated gas switch 87. Within the length of tube 83 is the second of the two vacuum control valves 33 to allow the operator to adjust the strength of the vacuum drawn on the supply reservoirs 11 when the mercury is being returned to each of reservoirs 11. One input port of second solenoid switch 87 is connected to tube 89 that is disposed to be connected to a vacuum source. A second input port of solenoid switch 87 is connected to tube 91 that provides intake air.

Supply reservoir 11 contains mercury 103 and an anti-bubble disc 101 through which tube 9 passes. When tube 9 is being cleared of mercury 103 after each probing of test wafer 105, bubbles are created in mercury 103 in supply reservoir 11 since tube 9 extends below the surface of mercury 103. In mercury, bubbles are very active and there is a greater likelihood that some of the mercury would splash up to the end of tube 79 and be drawn into recovery reservoir 13'. To prevent, or at least minimize, that from happening, anti-bubble disc 101 is included above the surface of mercury 103 in supply reservoir to break the bubbles. Additionally, since it is necessary to make electrical connection to test wafer 105 during "probing" with mercury 103, there must be a way to make electrical connection to mercury 103. That can be accomplished with at least a portion of tube 9 being metallic (e.g., stainless steel) to which electrical connection can be made with the electrical signals conducted through the metallic portion of tube 9 to mercury 103.

In operation, to insure good results when test wafer 105 is probed, the overall operation includes three steps: initial clearing of four-point probe passages 35 and tubes 9 of any debris and residue of mercury 103 that may have been left behind, and perhaps oxidized following the previous probing; advancing probe head 23 to the surface of wafer 105 and drawing the mercury "probe" up through passages 35; and recovering mercury 103 from passages and tubes 9 following each probe of wafer 105. The first step may only be necessary before a first probing of a number of probings that are conducted in rapid succession, however since passages 35 are so small it is envisioned that the first step should be performed before each probing of different locations on the same, or a different, wafer 105.

To perform the first step of clearing residue from passages 35 and tubes 9, first solenoid 85 is positioned to draw air from air line 91 and second solenoid 87 is set to the vacuum position. With the solenoids set, a vacuum is drawn on tube 83, recovery reservoir 13', tube 79, the top portion without mercury 103 of supply reservoir 11 which in turn draws on mercury 103 thus transferring the vacuum to tubes 9 and passages 35 in probe head 23. The top end of passages 35 create a vacuum in vacuum groove 40, vacuum port 73 and back through the tubing and recovery reservoir 13 to first solenoid switch 85 into which air is drawn. When passages 35 and tubes 9 are clear, air will be drawn into mercury 103 in the supply reservoirs 11 causing the bubbling discussed above.

Once the first step is completed, the second step begins by activating piston 27 to advance probe head 23 into position, as discussed previously. First solenoid switch 85 is positioned, as shown by the solid arrow, to draw a vacuum and second solenoid switch 87 is positioned, as shown by the solid arrow, to draw air. Then the vacuum source is activated with a vacuum being created in tubes 89, 81 and 77, as well as first recovery reservoir 13 and vacuum port 73 in probe head vacuum groove 40. The vacuum crated in groove 40 draws a vacuum in each of passages 35 in probe head 23 and tubes 9. The vacuum in tubes 9 in turn draw some of mercury 103 up into each of passages 35 from the respective supply reservoir 11. The drawing of mercury 103 from supply reservoirs 11 creates a temporary vacuum in the upper portion of each of reservoirs 11 as the level of mercury 103 drops transferring the vacuum to tube 79, second recovery reservoir 13, tube 83 and though switch 87 drawing in air to replace the vacuum created in the top of supply reservoirs 11. Once the mercury "probe" is in contact with wafer 105, electrical signals can be monitored or applied to each mercury "probe" by the electrical connection to the metallic portion of each of tubes 9.

In the second step, the probing mode, it is unlikely that any mercury will be drawn into tube 77 unless the vacuum level is too high. As a safety measure, first recovery reservoir 13 is included to receive any mercury that may have been drawn into tube 77. Since the ends of tubes 77 and 81 that extend through cap 93 on first recovery reservoir 13 do not extend far below cap 93, any mercury that tube 77 may deliver to reservoir 13 is not drawn out by tube 81 in the probing mode.

After the just tested location on wafer 105 has been performed in the probe mode, the operation performs the third step, the recovery mode. To initiate the recovery mode, the solenoid gas switches are activated to reverse their connections to the opposite of vacuum or air intake as positioned for the probe mode. Switch 85 now being in the air intake position and switch 87 being in the vacuum position (as illustrated by the broken line arrows), the vacuum-air flow is reversed from that in the probe mode. In the mercury recovery mode the vacuum applied to switch 87 is created in tubes 83 and 79 and second recovery reservoir 13' which creates a vacuum in the top of supply reservoir 11. The vacuum in reservoir 11 in turn draws up disk 101 and draws mercury 103 from tubes 9 and passages 35 back into supply reservoir 11. The vacuum now being drawn into passages 35, causes air to flow in switch 85 into tubes 81 and 77, and first recovery reservoir 13, vacuum port 73 and probe head vacuum groove 40. When all of mercury 103 is drawn back into supply reservoirs 11 from passages 35 and tubes 9, the vacuum is removed from the present invention thus putting the probe of the present invention in a rest mode.

In the recovery mode it is unlikely that any mercury will be drawn into tube 79 unless the vacuum level is too high. As a safety measure, second recovery reservoir 13' is include to receive any mercury that may have been drawn into tube 79. Since the ends of tubes 79 and 83 that extend through cap 93 on second recovery reservoir 13' do not extend far below cap 93, any mercury that tube 79 may deliver to reservoir 13' is not drawn out by tube 83 in the recovery mode, or tube 79 in the probe mode discussed above.

Next, FIG. 8 illustrates the internal and external electrical and pneumatic circuits, and the external equipment interfacing therewith, of the present invention. The components within the broken line in the left portion of the figure are items internal to the four-point probe assembly that have been discussed with respect to other figures. The interface between the internal and external devices is vacuum and electrical connector assembly 19. External devices interfacing with connector assembly 19 are system controller 105, first and second solenoids 85 and 87, respectively, measurement and output device 109, and optionally compressed air solenoid 119. Internal devices interfacing with connector assembly 19 are metallic portions of four tubes 9, one for each of the four probes, piston 27 and vacuum control valves 33 with the balance of the vacuum circuit shown and discussed in relation to FIG. 7.

The heart of the overall system is controller 105 that coordinates the operation of all of the external and internal components needed to exercise the present invention and to obtain the desired measurements in keeping with the operational discussion of FIG. 7. Controller 105 interfaces with measurement and output device 109, first and second solenoids 85 and 87, optional compressed air solenoid 119 and piston 27 that is internal to the automatic probe system of the present invention. Vacuum pump 107 is selected to pull a sufficiently strong vacuum to hold probe contact surface 43 to the surface of wafer 105 with the same pressure regardless of the thickness of wafer 105, as well as pull mercury into the four mercury probe guide passages 35 in probe head 23 and into contact with the surface of wafer 105, and not strong enough to make the mercury of the mercury probes merge into each other with the application of the vacuum controlled by first and second solenoids 85 and 87 and vacuum control valves 33 as discuss previously in relation to FIG. 7. Measurement and output device 109 is the same as those used for any type of four-point probe for making measurements on a surface of a wafer of the selected material.

Controller 105 is connected to piston 27 by electrical activation line 111 to control probe head 23 as it is advanced to, held in place on, and returned from, the downward facing surface of wafer 105 with pressure regulation being included in piston 27. Additionally, controller 105 is connected to first gas switch solenoid 85 and second gas switch solenoid 87 via switching signal lines 113 and 115, respectively. Further, vacuum pump 107 is connected to the solenoids 85 and 87 via a non-collapsible air line 89, with air input line 91 connected to another port of solenoids 85 and 87. Alternatively, and perhaps the preferred method of operation, piston 27 can be activated with compressed air in which case electrical connection line 111 to piston 27 will not be present, instead controller 105, via line 123 controls compressed air solenoid 119 that receives compress air from air compressor 125 and supplies compressed air to piston 27 via air line 121 under control of controller 105 with piston pressure regulated by the piston, the compressed air solenoid or the air compressor.

The above discussion has been focused on the application of a four-point probe, however the same system and method is applicable to mercury probe systems with any number of mercury contacts, from one contact to as many contacts as the application requires. Thus the claims should be read to include one or more contacts unless the claim specifically states the number of contacts that are being claimed.

The mercury probe disclosed here is able to facilitate a relatively large area mercury contact, in various shapes, spacings and number of contacts, given its upward orientation to probe the sample. Additionally, the present invention is designed to apply a fixed force regardless of the thickness of the wafer through the of use of a regulated pressure piston for push-pull operation. Still further, the present invention through the incorporation of a plurality of spring-loaded rod assemblies to support the probe head and the probe head being in a "floating" orientation always positions the face of the probe head that comes into contact with the surface of the wafer to make a full and consistent contact with the wafer and thus accurately places all mercury contacts on the surface of the wafer regardless of the inclination of the wafer as a result of the even support of the probe head by the spring-loaded rod assemblies.

While the present invention has been describe in a single embodiment in the figures, the scope of the present invention is not limited to that specific design, shapes and forms of the various components depicted herein. Seeing the design disclosed here, one skilled in the four-point probe art could easily make alternative equivalent designs, thus the present invention and the coverage provided here is only to be limited by the scope of the accompanying claims and equivalents to what is claimed.

What is claimed is:

1. A probe measurement system for a wafer mounted with the surface to be measured facing downward, said system comprising:
   a probe head with a flat face oriented upward with at least one probe passage defined through the probe head ending in an orifice on said face with said face disposed to make contact with the downward facing surface of said wafer during testing;
   a mercury supply system disposed to provide mercury to said at least one probe passage and to extend mercury to the opening on said face with a mercury contact made with the surface of the wafer from each of said at least one probe passage when the face of the probe head is in contact with the surface of the wafer; and
   a probe head positioning system to advance and retract said probe head to and from contact with the surface of the wafer before and after probing the surface of the wafer including:
   a piston to provide a regulated selected upward pressure when activated and to return to rest position when inactivated; and
   a spring system fixedly coupled between said piston and a back surface of said probe head to provide even support to the probe head;
   wherein said probe head is advanced to the surface of the wafer when said piston is activated and withdrawn from contact with the wafer when said piston is inactivated.

2. The probe measurement system of claim 1 wherein said orifice of each of said at least one probe passage is sized and shaped to make said mercury contact with the surface of the wafer having a selected size and shape from extremely small to fairly large.

3. The probe measurement system as in claim 2 wherein an extremely small diameter mercury contact provides a small diameter electrically conductive probe of the surface of the wafer to minimizing probe penetration of the wafer, mechanically and electrically.

4. The probe measurement system as in claim 1 wherein said mercury supply system includes:
   a separate source of mercury for each of said at least one probe passage defined through said probe head; and
   a separate mercury delivery tube between said each source of mercury and the corresponding at least one probe passage with at least a portion of each of said mercury delivery tube being electrically conductive to permit electrical connection to said mercury when in said tube.

5. The probe measurement system as in claim 4 further including electrical supply and measurement equipment coupled to each of said portions of said mercury delivery tubes for testing said wafer when mercury probes are in contact with the surface of said wafer.

6. The probe measurement system as in claim 1 wherein said piston provides a consistent pressure between the face of the probe head and the surface of the wafer when the face of the probe head is in contact with the surface of the wafer for wafers of a wide range of thicknesses.

7. The probe measurement system as in claim 1 wherein the upward pressure provided by the piston is adjustable.

8. The probe measurement system as in claim 1 wherein said piston is gas actuated with the pressure exerted by the piston through the spring system and the probe head being adjustable by varying the pressure of the gas activating the piston.

9. The probe measurement system as in claim 1 wherein said piston is returned to said rest position with a spring.

10. The probe measurement system as in claim 1 wherein said piston is returned to said rest position with a vacuum applied to the piston.

11. The probe measurement system as in claim 1 wherein said spring system is compressible to permit the face of said probe head to tilt as necessary to bring the face of the probe head into flat contact with the surface of the wafer for a wide range of inclinations of the surface of the wafer.

12. The probe measurement system as in claim 11 wherein said spring system includes at least three spring-loaded rod assemblies each being individually compressible.

13. The probe measurement system of claim 12 further includes a controller to control the operation of the mercury supply system and the probe head positioning system.

14. The probe measurement system of claim 1 further includes a controller to control the operation of the mercury supply system and the probe head positioning system.

15. A method of measurement of a wafer comprising the steps of:
   a. supporting said wafer with a surface to be measured facing downward;

b. orienting a probe head with a flat face upward with at least one probe passage defined through the probe head and opening on said face with said face disposed to make contact with the downward facing surface of said wafer during testing;

c. advancing said probe head upward and bring said flat face into contact with said downward facing surface of said wafer;

d. providing said at least one probe passage with mercury until a mercury contact is made with said downward facing surface of said wafer with said mercury in each of said at least one probe passages providing an electrically conductive probe to the surface of said wafer;

e. interconnecting an electrical measurement device to said mercury in each of said probe passage;

f. measuring selected electrical values from said wafer with said electrical measurement device via said mercury in each of said probe passages;

g. recovering said mercury from each of said at least one probe passage; and h. retracting said probe head from said surface of said wafer.

16. A probe measurement system for a wafer mounted with the surface to be measured facing downward, said system comprising:

a probe head with a flat face oriented upward with at least one probe passage defined through the probe head ending in an orifice on said face with said face disposed to make contact with the downward facing surface of said wafer during testing;

a mercury supply system disposed to provide mercury to said at least one probe passage and to extend mercury to the opening on said face with a mercury contact made with the surface of the wafer from each of said at least one probe passage when the face of the probe head is in contact with the surface of the wafer; and a mercury recovery system to recapture the mercury from said at least one probe passage in said probe head after each probing of the wafer surface and delivers the recovered mercury to said mercury supply system.

17. The probe measurement system of claim 16 wherein the mercury recovery system also clears said at least one probe passage and the recovered mercury of an debris.

18. The probe measurement system of claim 16 wherein said orifice of each of said at least one probe passage is sized and shaped to make said mercury contact with the surface of the wafer having a selected size and shape from extremely small to fairly large.

19. The probe measurement system as in claims 18 wherein an extremely small diameter mercury contact provides a small diameter electrically conductive probe of the surface of the wafer minimizing probe penetration of the wafer, mechanically and electrically.

20. The probe measurement system as in claim 16 wherein said mercury supply system includes:

a separate source of mercury for each of said at least one probe passage defined through said probe head; and a separate mercury delivery tube between said each source of mercury and the corresponding at least one probe passage with at least a portion of each of said mercury delivery tube being electrically conductive to permit electrical connection to said mercury when in said tube.

21. The probe measurement system as in claim 20 further including electrical supply and measurement equipment coupled to each of said portions of said mercury delivery tubes for testing said wafer when mercury probes are in contact with the surface of said wafer.

22. The probe measurement system as in claim 16 further comprising a probe head positioning system to advance and retract said probe head to and from contact with the surface of the wafer before and after probing the surface of the wafer.

23. A method of measurement of a wafer comprising the steps of:

a. supporting said wafer with the surface to be measured facing downward;

b. orienting a probe head with a flat face upward with at least one probe passage defined through the probe head and opening on said face with said face disposed to make contact with the downward facing surface of said wafer during testing;

c. advancing said probe head of step b. upward and to bring said flat face into contact with said downward facing surface of said wafer; and d. following step c. providing said at least one probe passage with mercury until a mercury contact is made with said downward facing surface of said wafer with said mercury in each of said at least one probe passages providing an electrically conductive probe to the surface of said wafer;

wherein step c. is performed with a piston coupled to said probe head to provide a regulated selected upward pressure of said flat face of said probe head on said surface of said wafer when activated and following step d. to return said probe head to a rest position when inactivated.

24. The method of claim 23 further includes the step of:

e. coupling said probe head to one end of a spring system and the other end of the spring system to said piston to provide even support to the probe head when said probe head is advanced to the surface of the wafer when said piston is activated and withdrawn from contact with the wafer when said piston is inactivated.

* * * * *